(12) United States Patent
Park

(10) Patent No.: US 7,071,054 B2
(45) Date of Patent: Jul. 4, 2006

(54) METHODS OF FABRICATING MIM CAPACITORS IN SEMICONDUCTOR DEVICES

(75) Inventor: Jeong Ho Park, Icheon-si (KR)

(73) Assignee: Dongbu Electronics, Co. Ltd., Seoul (KR)

(*) Notice: Subject to any disclaimer, the term of this patent is extended or adjusted under 35 U.S.C. 154(b) by 0 days.

(21) Appl. No.: 11/027,524

(22) Filed: Dec. 30, 2004

(65) Prior Publication Data

US 2005/0142737 A1   Jun. 30, 2005

(30) Foreign Application Priority Data

Dec. 31, 2003   (KR) ............... 10-2003-0102046

(51) Int. Cl.
*H01L 21/8242* (2006.01)

(52) U.S. Cl. ............ 438/243; 438/244; 438/253; 438/386; 438/387; 438/396; 438/692; 438/702; 257/E27.092; 257/E29.346; 257/E21.396; 257/E21.651

(58) Field of Classification Search ............... 438/386, 438/387, 396, 624, 626, 629, 631, 636–640, 438/642, 645, 675, 695, 696, 700–703, 761, 438/778, 780, 942, 957, 959, FOR. 220, 438/FOR. 388, FOR. 395, FOR. 430, 240, 438/243, 244, 253, 691, 692, 701, 702
See application file for complete search history.

(56) References Cited

U.S. PATENT DOCUMENTS 6,271,084 B1   8/2001 Tu et al.
6,346,454 B1 *  2/2002 Sung et al. ............... 438/396
6,413,815 B1 *  7/2002 Lai et al. .................. 438/243
6,593,185 B1 *  7/2003 Tsai et al. ................. 438/253
6,717,193 B1    4/2004 Olewine et al.
6,794,262 B1    9/2004 Ning et al.
2002/0185671 A1 * 12/2002 Kim ........................... 257/301
2003/0011043 A1 *  1/2003 Roberts ..................... 257/532
2003/0027385 A1 *  2/2003 Park et al. ................. 438/253
2003/0027386 A1 *  2/2003 Lee .......................... 438/253
2003/0092259 A1 *  5/2003 Ng et al. .................. 438/637

* cited by examiner

*Primary Examiner*—George Fourson
*Assistant Examiner*—Joannie Adelle Garcia
(74) *Attorney, Agent, or Firm*—Saliwanchik, Lloyd & Saliwanchik

(57) ABSTRACT

Methods of fabricating an MIM capacitor and a dual damascene structure of a semiconductor device are disclosed. According to one example, a method includes depositing a first insulating layer on a semiconductor substrate; forming a lower interconnect through the first insulating layer; sequentially depositing a second insulating layer, a third insulating layer, and a fourth insulating layer; forming a first mask pattern over the fourth insulating layer; forming a first dual damascene pattern by etching the fourth insulating layer; depositing a fifth insulating layer; forming a second mask pattern over the fifth insulating layer; forming dual damascene structure by performing an etching process; sequentially depositing a second conducting layer and a dielectric layer on the dual damascene structure; selectively removing some portion of the dielectric layer; depositing a third conducting layer over the dielectric layer; and planarizaing the top surface of the third conducting layer, the dielectric layer, and the second conducting layer by performing a CMP process.

13 Claims, 6 Drawing Sheets

METHODS OF FABRICATING MIM CAPACITORS IN SEMICONDUCTOR DEVICES

TECHNICAL FIELD

The present disclosure relates to semiconductor devices and, more particularly, to methods of fabricating metal-insulator-metal (MIM) capacitors in semiconductor devices.

BACKGROUND

In recently-developed merged memory logic (MML), a memory cell array such as dynamic random access memory (DRAM) and a logic array such as analog circuits or peripheral circuits are integrated in a single chip. With the advent of MML, multimedia functions have been greatly improved and, therefore, the high-integration and the high-speed operation of semiconductor device have been achieved more effectively.

To achieve the high-speed operation of analog circuits, a capacitor with high capacitance is in development. Generally, in a capacitor of polysilicon-insulator-polysilicon (PIP) structure, the interface between dielectric and upper/lower electrodes may be oxidized to form a natural oxide layer because the upper and lower electrodes are made of polysilicon. Such a natural oxide layer may lower the total capacitance of the capacitor. In addition, the capacitance of the capacitor may be reduced due to depletion regions that are created in the polysilicon layer. Such capacitors with low capacitance are unsuitable for use in devices requiring high-speed and high-frequency operation.

To obviate these problems, new capacitor structures such as metal-insulator-silicon (MIS) and metal-insulator-metal (MIM) have been suggested. Particularly, the MIM capacitor is broadly used in high performance semiconductor devices because it has low specific resistance and no parasitic capacitance due to depletion regions. Recently, technology for forming a metal interconnect of a semiconductor device using copper with low specific resistance instead of aluminum has been introduced. Therefore, various MIM capacitors with copper electrodes are being suggested.

FIGS. 1a and 1b are cross-sectional views illustrating a conventional process of fabricating an MIM capacitor and a dual damascene structure interconnect of a semiconductor device. As shown in FIG. 1a, a lower insulating layer 10 is deposited on a semiconductor substrate 1. A first metal interconnect 15 and a second metal interconnect 20 are then formed in the lower insulating layer 10. After a metal layer is deposited over the resulting structure, some portion of the metal layer is removed to form a lower electrode 25 of a capacitor on the second metal interconnect 20. A dielectric layer 30 is then deposited over the semiconductor substrate 1 including the lower capacitor electrode 25. After another metal layer is deposited on the dielectric layer 30, some portion of the another metal layer is removed to form an upper electrode 35 of a capacitor on the lower electrode 25. Next, an interlayer dielectric (ILD) layer 40 is deposited over the resulting structure.

Referring to FIG. 1b, the ILD layer 40 is planarizied by using a chemical mechanical polish (CMP) process. Some portion of the ILD layer 40 and dielectric layer 30 is then removed by using an etching process to form a via hole V1 through the ILD layer 40. The via hole V1 exposes some portion of the top surface of the first metal interconnect 15. Next, a first trench T1 is formed in the upper part of the via hole V1. A second trench T2 is formed through the ILD layer 40 on the upper electrode 35. The second trench T2 exposes some portion of the top surface of the upper electrode 35. The via hole V1, the first trench T1, and the second trench T2 are filled with copper and then planarized by using a CMP process. As a result, a damascene structure interconnect 45 and a contact plug 50 are completed.

However, the above-mentioned conventional process of fabricating an MIM capacitor and a dual damascene structure interconnect has several problems. First of all, the conventional process requires an additional metal interconnect process to form a metal interconnect to apply a bias to the lower electrode of the capacitor. In addition, the conventional process is rather complicated because the via hole and the trench on the upper electrode are formed by using separate unit processes.

In other respects, as utilization of a capacitor in logic devices increases, a capacitor with high capacitance is desperately required. Generally, the capacitance (C) of a capacitor is represented by the equation as follows:

$$C = \in As/d$$

Where $\in$ is the dielectric constant, As is the surface area of an electrode, and d is the thickness of dielectric.

Referring to the above-mentioned equation, there are three methods to increase the capacitance (C) of a capacitor within a limited unit surface area. The three methods are decreasing the thickness of dielectric (d) of a capacitor, increasing the surface area of the electrode (As) of a capacitor, and using materials with high dielectric constant ($\in$). Among them, to mention increasing the surface area of the electrode of a capacitor, a conventional analog capacitor has a limited two-dimensional active surface area because they use metal interconnects that connect various kinds of devices as the upper and lower electrodes of the capacitor.

FIGS. 2a through 2e are cross-sectional views illustrating a conventional process of fabricating an MIM capacitor and a contact plug of a semiconductor device. As shown in FIG. 2a, an ILD layer 2 is deposited on a substrate (not shown) having at least one predetermined structure. A metal layer is deposited on the ILD layer 2. Some portion of the metal layer is then removed to make a lower electrode 4a of a capacitor and a lower interconnect 4b. An inter-metal dielectric (IMD) layer 6 is deposited over the substrate including the ILD layer 2, the lower electrode 4a, and the lower interconnect 4b, and planarized by using a planarization process.

Referring to FIG. 2b, a contact hole 8 is formed through the IMD layer 6 on the lower electrode 4a by using a photolithography process. The contact hole 8 exposes some portion of the top surface of lower electrode 4a. The exposed top surface of lower electrode 4a becomes an active surface area of a capacitor.

Referring to FIG. 2c, a dielectric layer 10 is deposited on the structure of FIG. 2b.

Referring to FIG. 2d, a via hole 12 is formed through the dielectric layer 10 on the lower interconnect 4b by using a photolithography process. The via hole 12 exposes some portion of the top surface of lower interconnect 4b.

Referring to FIG. 2e, a conductive layer is deposited on the structure of FIG. 2d. Some portion of the conductive layer is removed to form an upper electrode 14a of a capacitor and an upper interconnect 14b.

However, the above-mentioned conventional MIM capacitor is subject to limitations in increasing the capacitance because it has a two-dimensional active surface area.

DETAILED DESCRIPTION

As disclosed herein, a dual damascene process forms both a via hole and a trench at once by using only one etching process. In detail, a first pattern for a via hole, i.e., the lower part of a damascene structure, is formed and an ILD layer is deposited over the first pattern. A second pattern for a trench, i.e., the upper part of damascene structure, is formed through the ILD layer. A dry etching process is performed by using the second pattern as an etch mask. By performing the etching process until the first pattern is exposed, a trench is completed. The same etching process is continuously carried out using the first pattern as an etch mask to form a via hole. The trench may be larger in width than the via hole. The self-aligned dual damascene structure may be formed by a via-first process which forms first a via hole and a trench later, or a trench-first process which forms first a trench and a via hole later. The via-first process has an advantage that it reduces the number of times that a mask process has to be performed, compared to the trench first process.

Figure 1A:
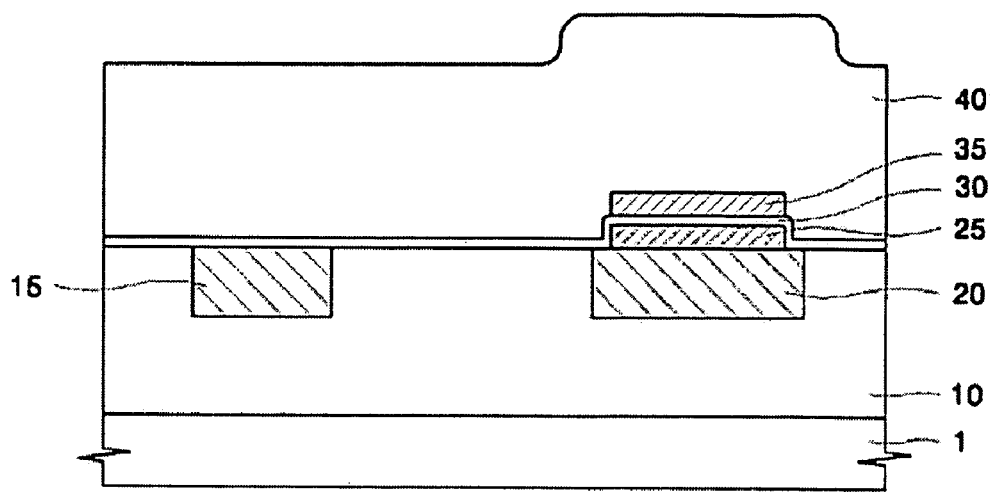
FIGS. 1a and 1b are cross-sectional views illustrating a conventional process of fabricating an MIM capacitor and a dual damascene structure interconnect of a semiconductor device.
Figure 1B:
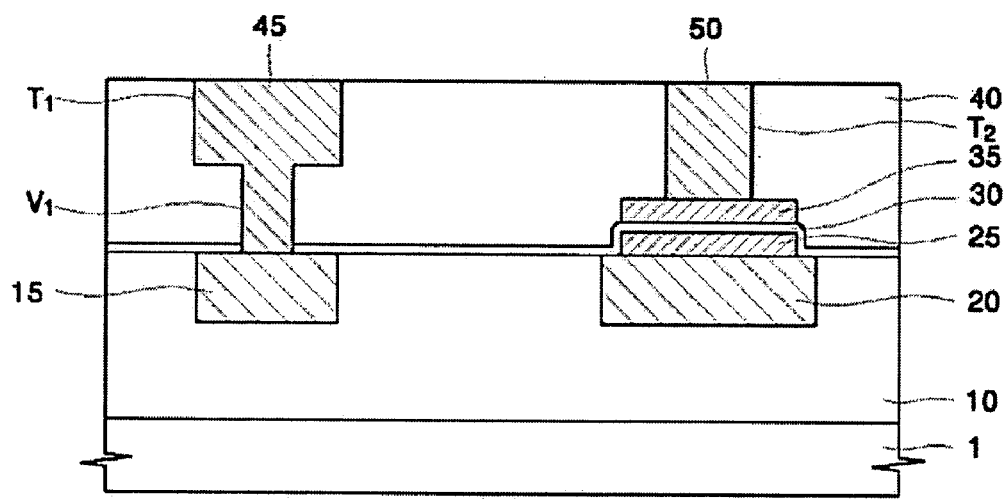
Figure 2A:
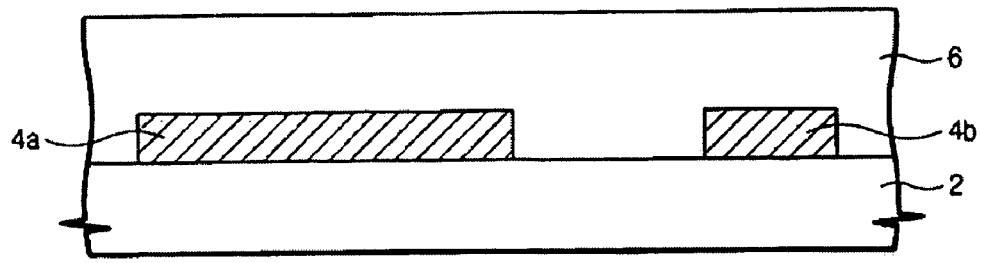
FIGS. 2a through 2e are cross-sectional views illustrating another conventional process of fabricating an MIM capacitor and a contact plug of a semiconductor device.
Figure 2B:
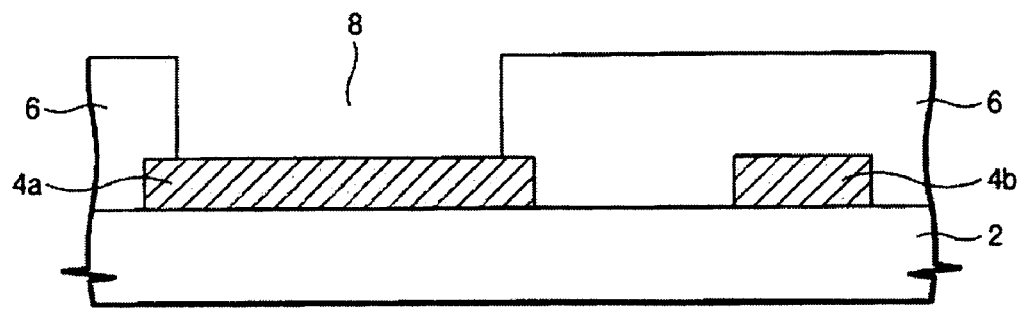
Figure 2C:
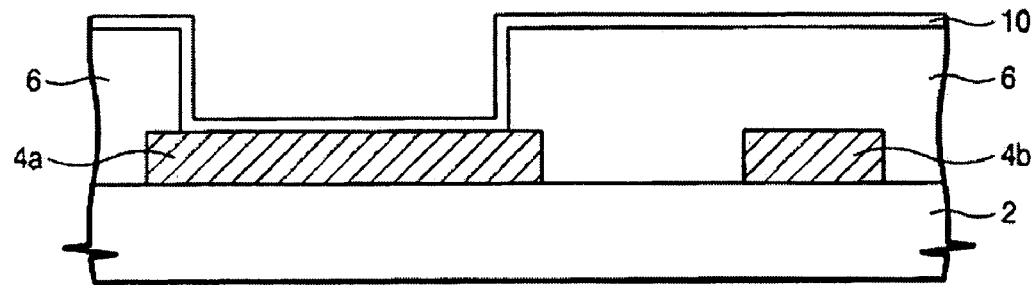
Figure 2D:
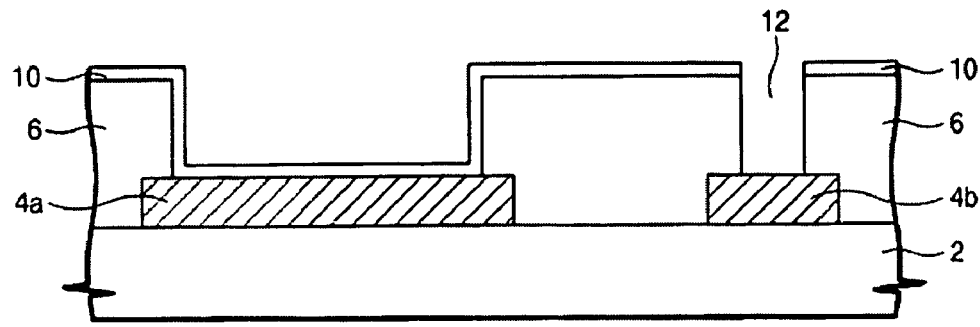
Figure 2E:
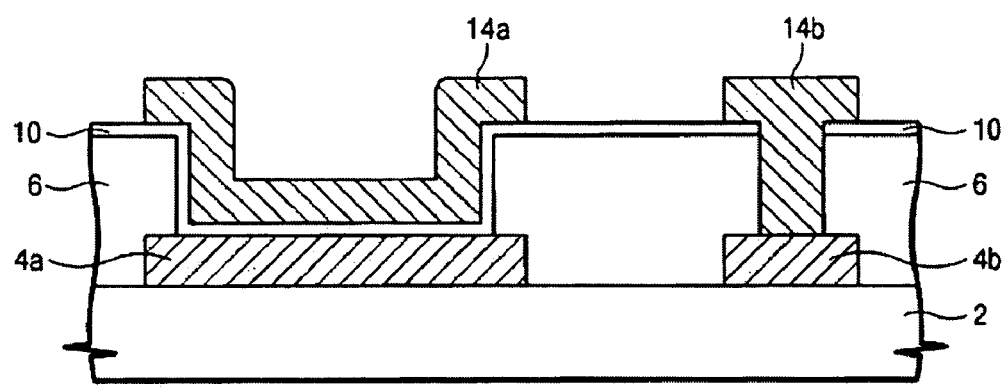
Figure 3A:
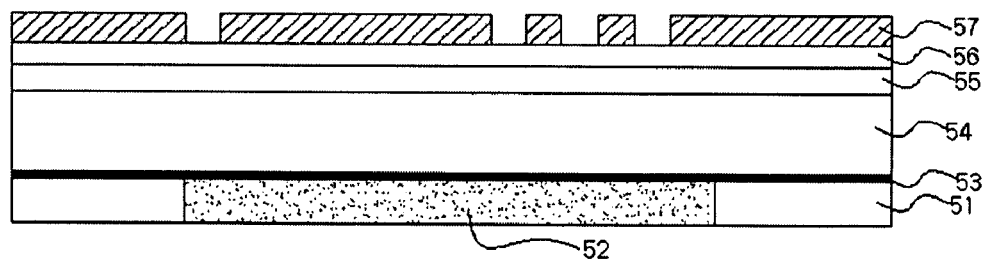
FIGS. 3a through 3f are cross-sectional views of semiconductor devices showing various stages of an example disclosed process of fabricating an MIM capacitor and a dual damascene structure.

Referring to FIG. 3a, a first insulating layer 51 is deposited on a substrate (not shown) having at least one predetermined structure. A damascene pattern is formed through the first insulating layer 51. A conductive metal is deposited over the resulting structure and planarized by using a chemical mechanical polish (CMP) process to make a first conducting layer 52. The CMP process is carried out until the top surface of the first insulating layer 51 is exposed. The first conducting layer 52 is used as a lower metal interconnect to apply a bias to a lower electrode of a capacitor to be formed later. A second insulating layer 53, a third insulating layer 54, and a fourth insulating layer 55 are sequentially deposited over the first insulating layer 51 and the first conducting layer 52. The second insulating layer 53 and fourth insulating layer 55 are used as etch-stop layers and may be made of nitride, silicon carbide (SiC), or aluminum oxide. The third insulating layer 54 is used as an ILD layer and preferably made of silicon oxide. Next, an organic first antireflection coating (ARC) 56 is formed on the fourth insulating layer 55. A first mask pattern 57 is then formed on the first ARC 56.

Figure 3B:
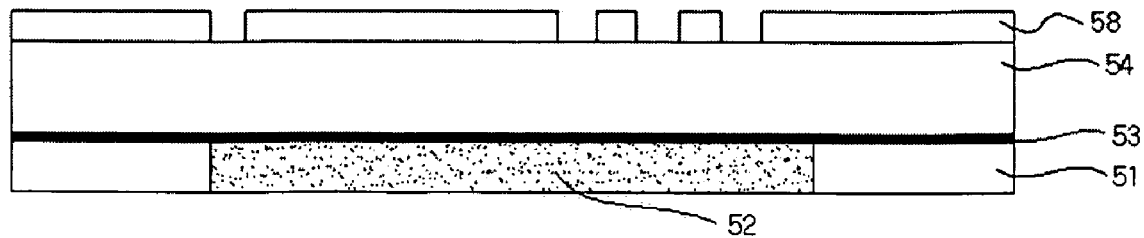

Referring to FIG. 3b, some portion of the first ARC 56 and the fourth insulating layer 55 is removed by a dry etching process using the first mask pattern 57 as a mask. The remaining first ARC 56 and the first mask pattern 57 are then removed by a wet etching process to complete a first dual damascene pattern 58. The first dual damascene pattern 58 is used as an etch-stop layer when a second dual damascene pattern is formed by later processes.

Figure 3C:
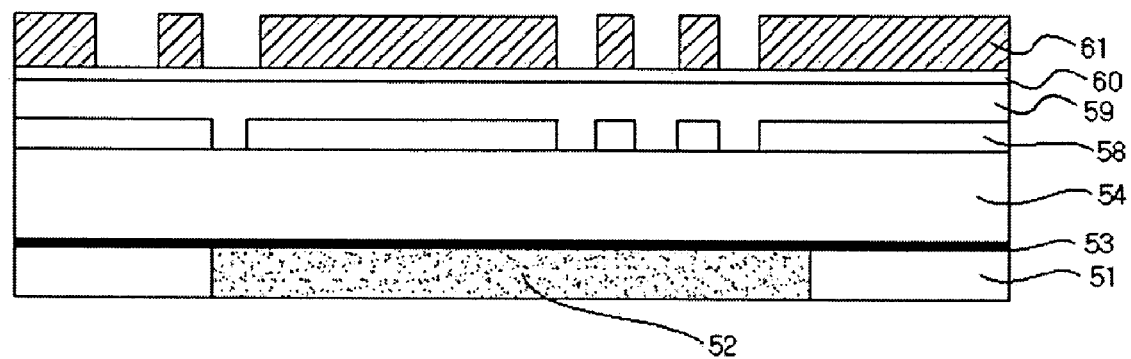

Referring to FIG. 3c, a fifth insulating layer 59 and a second ARC 60 are sequentially deposited over the structure of FIG. 3b. A second mask pattern 61 is formed on the second ARC 60.

Figure 3D:
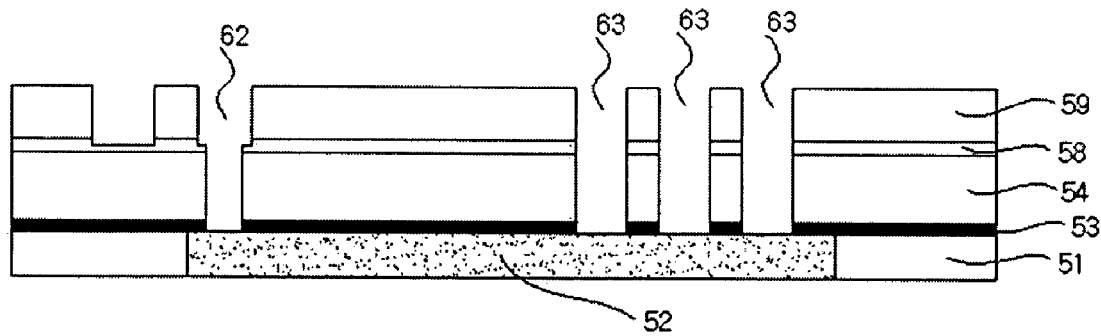

Referring to FIG. 3d, an etching process is performed by using the second mask pattern as a mask. By carrying out the etching process until the first dual damascene pattern 58 is exposed, a dual damascene trench is formed through the fifth insulating layer 59. The same etching process is continuously performed by using the first dual damascene pattern 58 as a mask. By carrying out the etching process until the top surface of the first conducting layer 52 is exposed, dual damascene via holes 62 and 63 are formed.

The second ARC 60 and the second mask pattern 61 are then removed by a wet etching to complete dual damascene structure. The dual damascene structure has a plurality of via holes 62 and 63, one of which is stepwise-shaped. In the stepwise-shaped via hole 62, the trench area formed by using the second mask pattern 61 is wider than the via hole area formed by using the first dual damascene pattern 58. The stepwise-shaped via hole 62 is in contact with the first conducting layer 52 to play the role of a contact plug that applies a bias to a lower electrode of a capacitor to be formed by later processes. The remaining via holes 63 except the stepwise-shaped via hole 62 are used to form a capacitor.

Figure 3E:
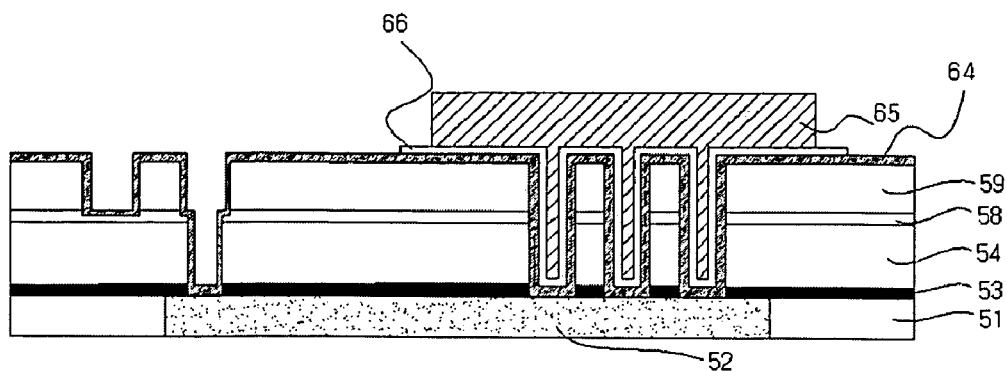

Referring to FIG. 3e, a second conducting layer 64 and an insulating layer 66 are sequentially deposited on the structure of FIG. 3d. The second conducting layer 64 and the insulating layer 66 are formed along the top surface of the fifth insulating layer 59 and along the bottoms and the sidewalls of via holes 62 and 63. The second conducting layer 64 is used as a lower electrode of a capacitor. The second conducting layer 64 is preferably a single layer of TaN, TiN, or WN, or a multi-layer comprising TaN, TiN, or WN. The insulating layer 66 is used as dielectric of a capacitor. The insulating layer 66 may be made of nitride, tetra ethoxy silane (TEOS), tantalum oxide, or aluminum oxide. Subsequently, some portion of the insulating layer 66 is removed by using photolithography and wet etching processes. In the illustrated example, by using a photoresist pattern 65 that covers the area of the via holes and exposes the other area, the insulating layer 66 remains on the area of the via holes. Next, the photoresist pattern 65 is removed.

Figure 3F:
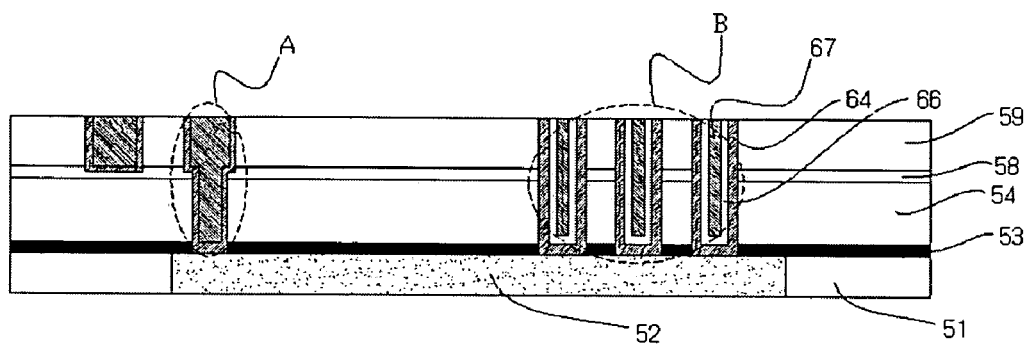

Referring to FIG. 3f, a third conducting layer 67 is deposited over the resulting structure of FIG. 3e. The third conducting layer is used as an upper electrode of a capacitor and may be a single layer of copper or a multi-layer comprising copper. A CMP process is performed until the fifth insulating layer 59 is exposed. Through the CMP process, the third conducting layer, the insulating layer, and the second conducting layer over the fifth insulating layer 59 and the area of the via holes are removed and the top area of the via holes are planarized. As a result, a capacitor comprising an upper electrode 67, dielectric 66, and a lower electrode 64 is formed in the via holes. In addition, a contact plug (A) for applying a bias to the lower electrode 64 of the capacitor is simultaneously formed and electrically connected with the first conducting layer 52.

In the illustrated example, because the capacitor is formed in the via holes, the surface area of the electrodes of the capacitor is larger than that of a conventional capacitor having flat-plate type electrodes. In addition, by simultaneously forming both the contact plug and the capacitor, the illustrated example process simplifies the manufacturing process.

Figure 4A:
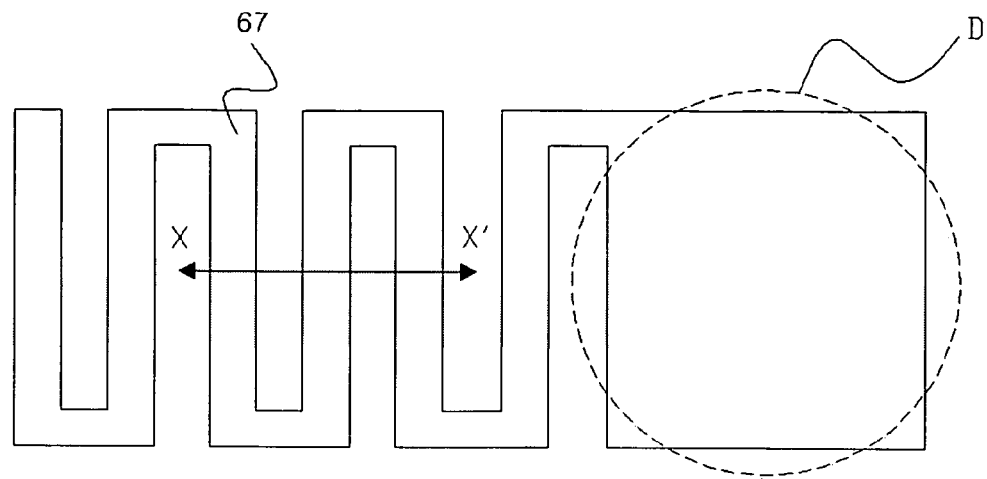
FIGS. 4a and 4b are top views of an MIM capacitor and a dual damascene structure fabricated as disclosed herein.
Figure 4B:
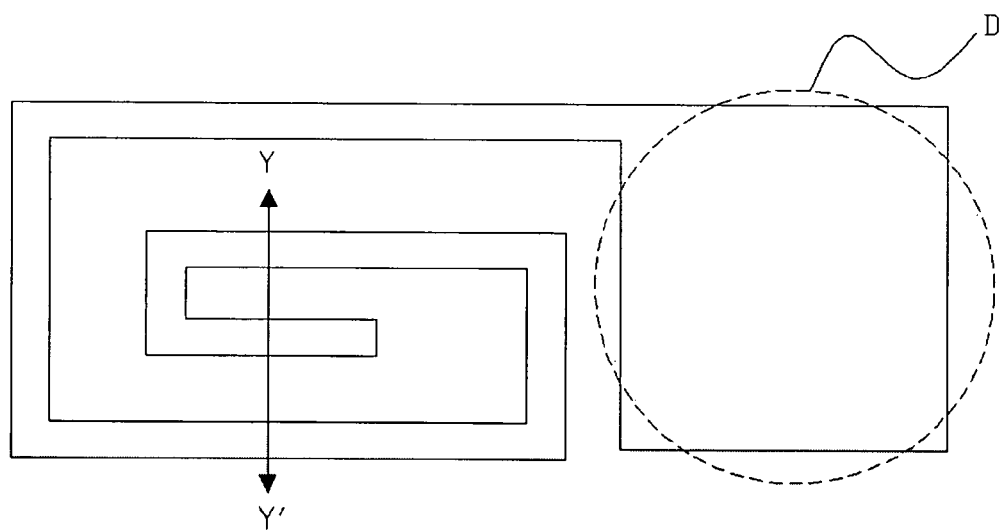

FIG. 4a is a top view illustrating an example of a meander type capacitor. A cross-section of FIG. 4a taken along the line X–X' is the capacitor area B of FIG. 3f. The area D is a pad part for applying a voltage to the upper electrode of the capacitor. FIG. 4b is a top view illustrating an example of a spiral type capacitor. A cross-section of FIG. 4b taken along the line Y–Y' is the capacitor area B of FIG. 3f. Thus, the active surface area of a capacitor within a unit area can be increased by fabricating the meander type or the spiral type capacitor.

From the foregoing, persons of ordinary skill in the art will appreciate that the above-described process of fabricating an MIM capacitor and a dual damascene structure simultaneously forms both the contact plug and the capacitor using one process, simplifying the manufacturing process and increasing the capacitance of the capacitor.

It is noted that this patent claims priority from Korean Patent Application Serial Number 10-2003-0102063, which was filed on Dec. 31, 2003, and is hereby incorporated by reference in its entirety.

Although certain example methods, apparatus and articles of manufacturing have been described herein, the scope of coverage of this patent is not limited thereto. On the contrary, this patent covers all methods, apparatus, and articles of manufacture fairly falling within the scope of the appended claims either literally or the doctrine of equivalents.

What is claimed is:

1. A method of fabricating a metal-insulator-metal capacitor of a semiconductor device comprising:
    depositing a first insulating layer on a semiconductor substrate having at least one predetermined structure;
    forming a first conducting layer as a lower interconnect through the first insulating layer;
    sequentially depositing a second insulating layer, a third insulating layer, and a fourth insulating layer over the first insulating layer and the first conducting layer;
    forming a first mask pattern over the fourth insulating layer;
    forming a first dual damascene pattern by etching the fourth insulating layer using the first mask pattern as a mask;
    depositing a fifth insulating layer over the first dual damascene pattern;
    forming a second mask pattern over the fifth insulating layer;
    forming a dual damascene structure by performing an etching process using the second mask pattern and the first dual damascene pattern as a mask, respectively;
    sequentially depositing a second conducting layer and a dielectric layer along a surface of the dual damascene structure;
    selectively removing some portion of the dielectric layer so that the dielectric layer remains on an area for the capacitor;
    depositing a third conducting layer over the dielectric layer; and
    planarizing a top surface of the third conducting layer, the dielectric layer, and the second conducting layer by performing a chemical mechanical polish process.

2. A method as defined by claim 1, further comprising depositing an antireflection coating before the first mask pattern is formed on the fourth insulating layer.

3. A method as defined by claim 1, further comprising depositing an antireflection coating before the second mask pattern is formed on the fifth insulating layer.

4. A method as defined by claim 1, wherein the second and the fourth insulating layers are used as a etch-stop layers, respectively and made of nitride, silicon carbide (SiC), or aluminum oxide.

5. A method as defined by claim 1, wherein the third insulating layer is used as an interlayer dielectric layer and made of silicon oxide.

6. A method as defined by claim 1, wherein the fifth insulating layer is used as an interlayer dielectric layer and made of silicon oxide.

7. A method as defined by claim 1, wherein the chemical mechanical polish process is performed until the fifth insulating layer is exposed.

8. A method as defined by claim 1, wherein the dual damascene structure comprises a plurality of via holes.

9. A method as defined by claim 8, wherein the plurality of via holes comprise at least one stepwise-shaped via hole, an upper part of which is wider than a lower part thereof.

10. A method as defined by claim 1, wherein selectively removing some portion of the dielectric layer is performed by using a wet etching process and a photoresist pattern which covers the area for the capacitor and exposes another area.

11. A method as defined by claim 1, wherein the second conducting layer is a single layer made of TaN, TiN or WN, or a multi-layer comprising TaN, TiN, or WN, and used as a lower electrode of the capacitor.

12. A method as defined by claim 1, wherein the dielectric layer is made of nitride, tetra ethoxy silane, tantalum oxide, or aluminum oxide.

13. A method as defined by claim 1, wherein the third conducting layer is a single layer of copper or a multi-layer comprising copper, and used as an upper electrode of the capacitor.

* * * * *

UNITED STATES PATENT AND TRADEMARK OFFICE
CERTIFICATE OF CORRECTION

| | | |
|---|---|---|
| PATENT NO. | : 7,071,054 B2 | Page 1 of 1 |
| APPLICATION NO. | : 11/027524 | |
| DATED | : December 30, 2004 | |
| INVENTOR(S) | : Jeong Ho Park | |

It is certified that error appears in the above-identified patent and that said Letters Patent is hereby corrected as shown below:

On Title Page, Item (30) Col. 1
Foreign Application Priority Data,
"10-2003-0102046" should read --10-2003-0102063--.

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,071,054 B2 | Page 1 of 1 |
| APPLICATION NO. | : 11/027524 | |
| DATED | : July 4, 2006 | |
| INVENTOR(S) | : Jeong Ho Park | |

It is certified that error appears in the above-identified patent and that said Letters Patent is hereby corrected as shown below:

On Title Page, Item (30) Col. 1
Foreign Application Priority Data,
"10-2003-0102046" should read --10-2003-0102063--.

This certificate supersedes Certificate of Correction issued September 19, 2006.

Signed and Sealed this

Twenty-fourth Day of October, 2006

JON W. DUDAS
*Director of the United States Patent and Trademark Office*